United States Patent [19]

Horikawa et al.

[11] Patent Number: 5,053,835
[45] Date of Patent: Oct. 1, 1991

[54] INP SEMICONDUCTOR THIN FILM ON SI

[75] Inventors: Hideaki Horikawa; Masahiro Akiyama, both of Tokyo, Japan

[73] Assignee: Oki Electric Industry Co., Ltd., Tokyo, Japan

[21] Appl. No.: 560,168

[22] Filed: Jul. 31, 1990

Related U.S. Application Data

[62] Division of Ser. No. 308,252, Feb. 9, 1989, Pat. No. 4,965,224.

[30] Foreign Application Priority Data

Feb. 16, 1988 [JP] Japan .................................. 63-31878

[51] Int. Cl.$^5$ .......................................... H01L 29/161
[52] U.S. Cl. ........................................ 357/16; 357/60; 357/59; 357/30; 357/2
[58] Field of Search ............... 357/16, 60, 30 E, 59 B, 357/2

[56] References Cited

U.S. PATENT DOCUMENTS 4,561,916 12/1985 Akiyama et al. ................. 357/16 X

FOREIGN PATENT DOCUMENTS 0291346 11/1988 European Pat. Off. .

OTHER PUBLICATIONS

Razeghi et al., "First Room-Temperature CW Operation of a GaInAsP/InP Light-Emitting Diode," *Appl. Phys. Lett.* 53(10), Sep. 5, 1988, pp. 854-855.

Razeghi et al., "High-Quality GaInAsP/InP Heterostructures Grown by Low-Pressure Metalorganic Chemical Vapor Deposition on Silicon Substrates," *Appl. Phys. Lett.* 52(3), Jan. 18, 1988, pp. 209-211.

Crumbaker et al., "Growth of InP on Si Substrates by Molecular Beam Epitaxy," *Appl. Phys. Lett.* 54(2), Jan. 9, 1989, pp. 140-142.

Kaminishi, "GaAs on Si Technology," *Solid State Technology*, Nov. 1987, pp. 91-97.

Akiyama et al., "Growth of High Quality GaAs Layers on Si Substrates by MDCVD," *Journal of Crystal Growth* 77 (1986) 490-497.

Uchida et al., "InP Solar Cell (ii); Direct Growth of InP on Si Substrate and Junction Formation", *Preprint of Symposium of Japanese Society of Applied Physics*, 1986 Autumn, p. 706, No. 30, P. D-6; p. 706.

Primary Examiner—William Mintel
Attorney, Agent, or Firm—Edward D. Manzo

[57] ABSTRACT

An InP semiconductor thin film is formed by a process in which an amorphous GaAs buffer layer having a good surface flatness, and then an amorphous InP buffer layer having a good surface flatness are formed on an Si substrate, and then an InP monocrystalline thin film is grown on the InP buffer layer. GaAs has a lattice constant intermediate between Si used as the substrate and InP, so the lattice mismatch is reduced.

4 Claims, 2 Drawing Sheets 5,053,835

INP SEMICONDUCTOR THIN FILM ON SI

This is a division of application Ser. No. 07/308,252, filed Feb. 9, 1989, now U.S. Pat. No. 4,965,224 issued Oct. 23, 1990.

BACKGROUND OF THE INVENTION

The present invention relates to an InP semiconductor thin film and process of fabricating the same, and more particularly a process of fabricating a semiconductor thin film comprising an InP monocrystalline layer on an Si substrate used for opto-electronic integrated circuits (OEICs), optical devices, and the like.

In a prior-art process for fabricating an InP semiconductor thin film, an InP monocrystalline thin film is formed directly on a Si substrate.

In another prior-art process, an InP buffer layer is formed on an Si substrate, and then an InP semiconductor thin film is formed on the InP buffer layer.

FIG. 2 shows an InP semiconductor thin film formed in the latter process. In the figure, reference numeral 1 denotes an Si substrate having a surface with a (100) orientation. Reference numeral 3 denotes an InP buffer layer. Reference numeral 4 denotes an InP monocrystalline layer. This InP semiconductor thin film is formed by first using reduced-pressure metal organic chemical vapor deposition (MOCVD), and triethyl-indium (TEI) and phosphine ($PH_3$) as raw materials, to form the InP buffer layer 3 on the Si substrate 1 at a temperature of 380° C., and then crystal-growing InP monocrystalline thin film 4 on the InP buffer layer 3 at 600° C. As this process achieves InP crystal growth in two steps, this process is called two-step growth method. See for example *Ohyobutsuri Gakkai Gakujutsu Koenkai Yokoshu* (Preprints of the Symposium of the Japan Society of Applied Physics) 1986 (Autumn), page 706, No. 30p-D-6. The InP monocrystalline thin film 4 formed by the two-step crystal-growth method has an improved surface state than an InP monocrystalline thin film obtained by the single-step growth method in which an InP monocrystalline film is directly formed on an Si substrate.

However, the surface of the resultant InP semiconductor thin film obtained by the prior-art processes is not flat, nor specular (mirror-like), and the film is therefore not satisfactory for practical use. This is considered to be due to the fact that InP having a lattice constant about 8% larger than that of Si is directly crystal-grown on the Si substrate, and crystal defects due to lattice mismatch occur.

SUMMARY OF THE INVENTION

An object of the present invention is to eliminate the problem of crystal defects and surface roughness due to the crystal mismatch in the InP semiconductor thin film formed by the prior-art method.

Another object of the present invention is to provide a process of fabricating an InP semiconductor thin film having an InP monocrystalline thin film with an improved crystal quality.

In a process of fabricating an InP semiconductor thin film according to the invention, an Si substrate is heated, an amorphous GaAs buffer layer having a good surface flatness is formed on the Si substrate, then an amorphous InP buffer layer having a good surface flatness is formed on the amorphous GaAs buffer layer, and finally an InP monocrystalline thin film is grown on the InP buffer layer.

The GaAs used for InP semiconductor thin film in the present invention has a lattice constant intermediate between the lattice constants of Si used as the substrate and of InP. Distortion of the lattice of the InP monocrystalline thin film is therefore smaller than if the InP monocrystalline thin film is formed directly on the Si substrate or grown on an InP buffer layer which in turn is formed on an Si substrate.

Incidentally, another method for alleviating lattice mismatch can be contemplated in which a GaAs buffer layer, a GaAs monocrystalline layer, a GaAs buffer layer, and InP monocrystalline thin film are stacked in this order on an Si substrate. But, according to the invention, the object is accomplished is by simply inserting a GaAs layer and without substantially increasing the number of process steps.

DETAILED DESCRIPTION OF THE EMBODIMENTS

Embodiments of the invention will now be described with reference to the drawings.

Figure 1:
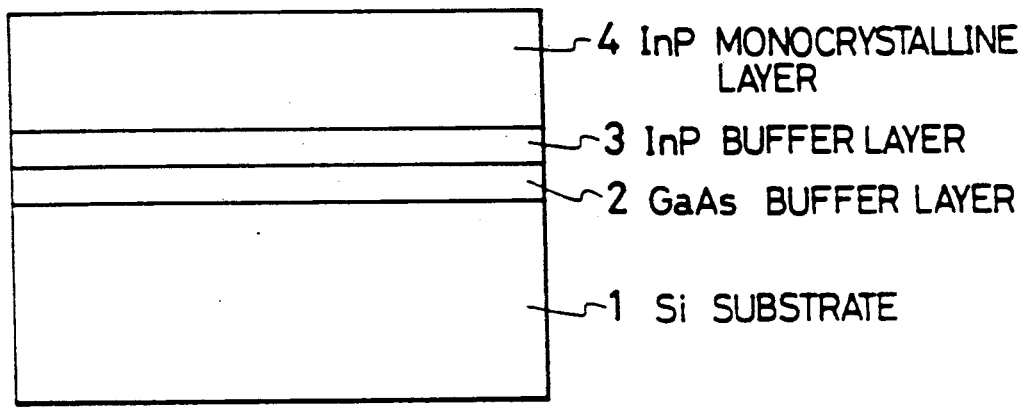
FIG. 1 is a sectional view for explaining the structure of an InP semiconductor thin film according to the invention.
Figure 2:
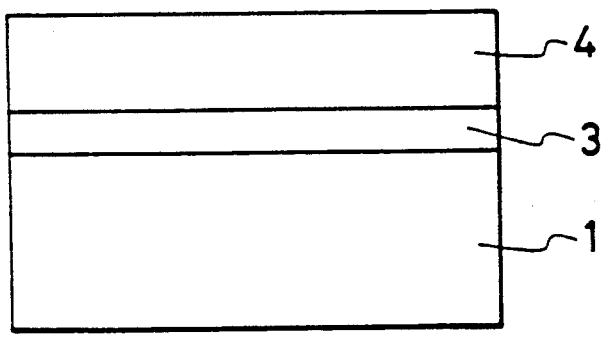
FIG. 2 is a diagram for explaining the structure of a prior-art InP semiconductor thin film.

FIG. 1 is a sectional view for explaining an InP semiconductor thin film according to the invention. In the figure, reference numeral 1 denotes a Si substrate having a surface with (100) orientation. Reference numeral 2 denotes a GaAs buffer layer 2. Reference numeral 3 denotes an InP buffer layer. Reference numeral 4 denotes an InP monocrystalline thin film. The InP semiconductor thin film according to the invention has a structure as shown in FIG. 1, in which the GaAs buffer layer 2, the InP buffer layer 3, and the InP monocrystalline thin film 4 are stacked in this order on the Si substrate 1.

The InP semiconductor thin film shown in FIG. 1 is fabricated by a process in which the Si substrate 1 is cleaned, the amorphous GaAs buffer layer 2 having a good surface flatness and amorphous InP buffer layer 3 having a good surface flatness are successively formed on the Si substrate 1, and then the InP monocrystalline thin film 4 is grown on the InP buffer layer. The above-mentioned reduced-pressure MOCVD is preferably used for the formation of the layers 2 to 4.

The respective process steps will now be described.

First, a Si substrate is provided. The Si substrate should have a surface with an orientation (100). The amorphous GaAS buffer layer 2 having a good surface flatness is formed on the Si substrate 1. The amorphous GaAS buffer layer 2 having a good surface flatness can be formed, for example by the method described in the following publication: Journal of Crystal Growth, Vol. 7, Pages 490 to 497 (1986). That is, the Si substrate 1 is first subjected to chemical-etching using hydrofluoric acid (HF) to remove the surface oxide film. Then, the Si substrate 1 is introduced in a reduced-pressure MOCVD reactor. The Si substrate 1 is then subjected to heat-treatment or baking for in a mixture gas of arsine ($AsH_3$) gas and hydrogen and at a temperature of 900°

C. or higher. With this heat-treatment, the surface of the Si substrate 1 is effectively cleaned. Then, the GaAs buffer layer 2 of a thickness of 200 angstroms or less is formed using arsine gas and trimethyl-gallium (TMG) as raw materials and at a temperature of 450° C. or lower (the lower limit is the limit of growth which is about 300° C.).

If the GaAS buffer layer 2 is formed under such a condition, an amorphous GaAS buffer layer 2 having a good surface flatness is obtained.

Incidentally, where a GaAs monocrystalline layer is grown directly on the Si substrate 1, there will be lattice mismatch of 4% and the surface will not be flat.

Other conditions of growth can be adopted as long as the GaAS buffer layer 2 is amorphous and has a flat surface.

Next, the amorphous InP buffer layer 3 having a similarly good surface flatness is grown to overlie on the amorphous GaAS buffer layer 2 having a good surface flatness that has thus been grown. The film of the InP buffer layer 3 can be formed using the reduced-pressure MOCVD, at a temperature of 550° C. or lower (the lower limit is the limit of growth which is about 300° to 350° C.), and using phosphine and trimethyl-indium (TMI) or triethyl-indium (TEI) as raw materials, with a molar ratio $PH_3/TMI$ or TEI being in the order of 500. The InP buffer layer 3 will be an amorphous film having a good surface flatness. It is more desirable that the InP buffer layer 3 is thinner, within the limit in which the lattice distortion can be alleviated. The thickness of about 200 angstroms is preferable.

On top of the InP buffer layer 3, the InP monocrystalline thin film 4 is grown to a predetermined thickness, at a temperature of 600° to 650° C. As the raw materials, phosphine and TMI or TEI can be used with the molar ratio $PH_3/TMI$ or TEI being about 100.

Figure 3:
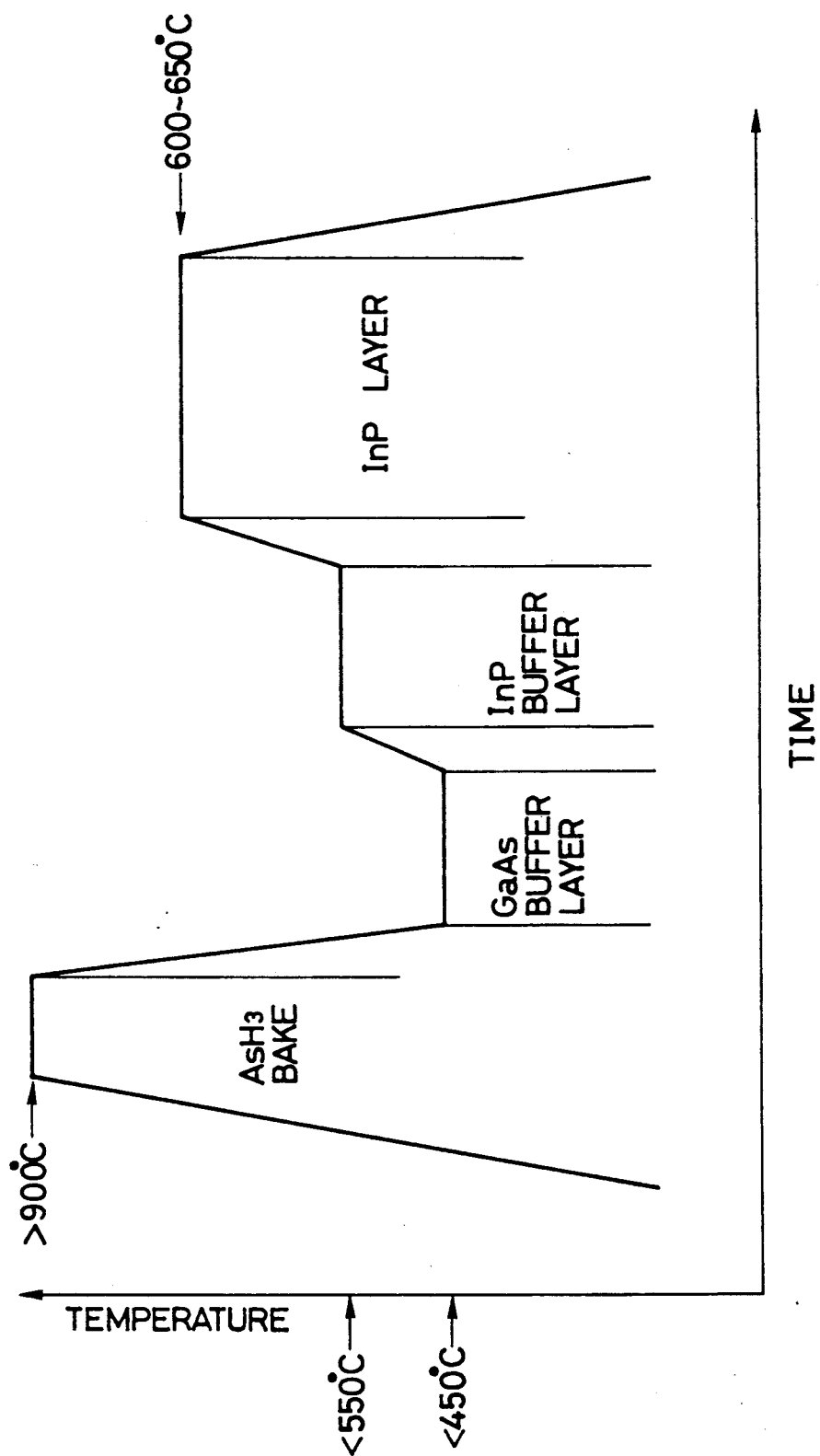
FIG. 3 is a diagram for showing an example of temperature-time program in the process of the invention.

FIG. 3 shows an example of temperature-time program in the present invention. The exact time in the figure differs depending on the growth conditions, and should be determined to give the predetermined film thickness.

In the present invention, both of the GaAS buffer layer 2 and the InP buffer layer 3 are formed at a temperature lower, by 100° to 200° C. or more, than the normal crystal growth temperature. Accordingly, flat layers are obtained even on a crystal having a substantially different lattice constant. However, these layers have poor monocrystalline quality, as evidenced by X-ray diffraction, or the like, and cannot be used for formation of semiconductor devices. For this reason, InP having a good monocrystalline quality is grown at a temperature of 600° or higher.

It is considered that the GaAS buffer layer 2 and the InP buffer layer 3 having a poor crystal quality serve to alleviate distortion in the lattice within InP monocrystalline layer during temperature elevation above 600° C. or during growth of the InP monocrystalline thin film 4, and while many crystal defects are left in these buffer layers, the InP monocrystalline thin film 4 will have a good flatness and good crystal quality.

As has been described in detail, according to the process of the invention, a GaAs buffer layer having a lattice constant intermediate between the InP and Si is formed on the Si substrate, an InP buffer layer is formed thereon, to form two-layer buffer layer. Accordingly, distortion and crystal defects due to lattice mismatch can be absorbed, and their occurrence can thereby be avoided. As a result, on the buffer layer, an InP monocrystalline thin film having a flat surface and a good crystal quality can be formed.

What is claimed is:

1. An InP semiconductor thin film comprising:
    a Si substrate;
    a GaAs buffer layer formed on the Si substrate;
    an InP buffer layer formed on the GaAs buffer layer; and
    an InP monocrystalline thin film formed on the InP buffer layer.

2. An InP semiconductor thin film according to claim 1, wherein said Si substrate has a surface with substantially (100) orientation.

3. An InP semiconductor thin film according to claim 1, wherein said GaAs buffer layer is an amorphous GaAs layer.

4. An InP semiconductor thin film according to claim 1, wherein said InP buffer layer is an amorphous InP layer.

* * * * *